(12) United States Patent
Kim

(10) Patent No.: US 6,459,154 B2
(45) Date of Patent: Oct. 1, 2002

(54) BONDING PAD STRUCTURE OF A SEMICONDUCTOR DEVICE AND METHOD OF FABRICATING THE SAME

(75) Inventor: Hyun-Chul Kim, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/742,062

(22) Filed: Dec. 22, 2000

(30) Foreign Application Priority Data

Jun. 23, 2000 (KR) ........................................ 2000-34902

(51) Int. Cl.[7] .......................... H01L 23/48; H01L 29/40
(52) U.S. Cl. ....................... 257/758; 257/774; 257/784; 257/786
(58) Field of Search ........................ 257/750, 751–774, 257/775, 776, 779, 780, 781, 784, 786

(56) References Cited

U.S. PATENT DOCUMENTS

| | | | | |
|---|---|---|---|---|
| 4,827,376 A | * | 5/1989 | Voss | 361/708 |
| 5,262,352 A | * | 11/1993 | Woo et al. | 438/625 |
| 5,925,931 A | * | 7/1999 | Yamamoto | 257/737 |
| 5,937,324 A | * | 8/1999 | Abercrombie et al. | 438/648 |
| 5,965,903 A | * | 10/1999 | Chittipeddi et al. | 257/48 |

FOREIGN PATENT DOCUMENTS

JP            07135211 A  *  5/1995

* cited by examiner

*Primary Examiner*—Eddie Lee
*Assistant Examiner*—Chris C. Chu
(74) *Attorney, Agent, or Firm*—Volentine Francos, PLLC

(57) ABSTRACT

A bonding pad structure and a method of fabricating the bonding pad structure allow for a large assembly process margin in the process of connecting a lead to the bonding pad structure. A first insulating layer is formed on a semiconductor substrate. A first conductive layer pattern is formed on a portion of the first insulating layer. The substrate and the first conductive layer pattern are covered with a second insulating layer. A second conductive layer pattern is formed on a portion of the second insulating layer so as to be disposed directly over the first conductive layer pattern. The resultant structure is covered with a third insulating layer. The third insulating layer and the second insulating layer are sequentially patterned to form a via hole through which the top surface of the second conductive layer pattern and a peripheral portion of the first conductive layer pattern are exposed. The via hole is then filled with a third conductive layer which is patterned and electrically connects the second and first conductive layer patterns.

11 Claims, 7 Drawing Sheets

BONDING PAD STRUCTURE OF A SEMICONDUCTOR DEVICE AND METHOD OF FABRICATING THE SAME

BACKGROUND OF THE INVENTION

1. Field of the Invention

The present invention relates to a semiconductor device and to a method of fabricating a semiconductor device. More particularly, the present invention relates to the bonding pad structure of a semiconductor device and to a method of fabricating the same.

This application is a counterpart of, and claims priority to, Korean patent application No. 2000-34902, filed Jun. 23, 2000, the contents of which are incorporated herein by reference in their entirety.

2. Description of the Related Art

As is well known, semiconductor chips are sealed to protect them from external moisture and impact. In addition, a semiconductor device requires a plurality of bonding pads for delivering an electrical signal between its semiconductor chip and external electronics. During assembly, i.e., during a packaging process, the bonding pads of a semiconductor device are electrically connected to lead lines of a lead frame with conductive material such as gold wire. At this time, heat and pressure are applied to the bonding pads for electrically connecting them to the gold wire. As a result, the bonding pads are subject to damage due to the thermal and physical stresses.

Recently, a ball grid array package technique has been widely used to fabricate semiconductor devices. According to the ball grid array package technique, a beam lead is placed directly in contact with the bonding pad. As a result, the bonding pad is likely to suffer from mechanical stress produced by the beam lead and may be damaged. Furthermore, if the ball grid array package is to be made thin, the angle between the beam lead and an upper surface of the bonding pad must be kept to 15 degrees or less. In addition, recent trends in miniaturizing the ball grid array packages have resulted in the bonding pads being downsized. Accordingly, as the level of the center of a bonding pad becomes lower as compared to a top surface of a passivation layer which exposes the bonding pad, the alignment margin of the beam lead is correspondingly decreased.

U.S. Pat. No. 5,736,791 by Fujiki et al., entitled "Semiconductor Device And Bonding Pad Structure Thereof" discloses a bonding pad structure of a semiconductor device having a multi-layered interconnection. The bonding pad structure includes a first metal layer and a second metal layer formed over the first metal layer. An interlayer insulating layer is interposed between the first metal layer and the second metal layer. A plurality of metal plugs penetrate the interlayer insulating layer and electrically interconnect the first metal layer and the second metal layer. The first metal layer is patterned to have a plurality of slits, or the center thereof is etched so as to be open. Accordingly, the surface area of the first metal layer is much less than that of the second metal layer. As a result, most of the second metal layer is directly in contact with the interlayer insulating layer. Thus, the thickness of the bonding pad with which gold wire or beam lead is directly in contact corresponds to only the thickness of the second metal layer. Therefore, an electrical open failure can occur during the process of bonding the gold wire or beam lead.

SUMMARY OF THE INVENTION

It is an object of the present invention to provide a reliable bonding pad structure, which provides a relatively large alignment margin for a beam lead.

It is another object of the present invention to provide a method of fabricating a reliable bonding pad structure, which also allows for a large alignment margin when a beam lead is to be bonded thereto.

In order to achieve these objects, the present invention provides/fabricates structure of a semiconductor device, and in particular bonding pad structure, in which there is substantially no height difference (step) between the central region of the top surface of a third conductive layer pattern, to which the beam lead is to be bonded, and the top surface of a third insulating layer patterned to form the via in which the third conductive material layer pattern is formed.

In the present invention, first, second and third conductive layer patterns are disposed on a semiconductor substrate with the second and third conductive layer patterns contacting each other. An insulator is interposed between the first and second conductive layer patterns. In addition, the third conductive layer pattern is electrically connected to the first conductive layer pattern through an opening.

The opening extends through a peripheral edge portion of the second conductive layer pattern and through the insulating layer, and terminates at a peripheral edge portion of the first conductive layer pattern. The opening can consist of an annular slit or can comprise a plurality of discrete holes.

Alternatively, the opening is located outwardly of the second conductive layer pattern, exposes and extends alongside the peripheral edge of the second conductive layer pattern. The opening also extends downwardly through the insulating layer, and terminates at the peripheral edge portion of the first conductive layer pattern. In this case, the second conductive layer pattern is narrower than the first conductive layer pattern. Preferably, the opening consists of an annular slit.

The method of fabricating the above-described bonding pad structure begins with the forming of an insulating layer over a semiconductor substrate on which a first conductive layer pattern has been formed followed by the forming of a second conductive layer pattern on the insulating layer directly above the first conductive layer pattern. The second conductive layer pattern includes an opening extending therethrough at a peripheral portion thereof. The opening exposes the insulating layer covering the first conductive layer pattern. Another insulating layer is formed on the second conductive layer pattern. The insulating layers are then sequentially etched to form a via hole that exposes a central portion of the top surface of the second conductive layer pattern, and the opening, and to extend the opening down to the first conductive layer pattern. Conductive material is deposited to fill the via hole and the extended opening. Thus, a third conductive layer pattern electrically connecting the top surface of the second conductive layer pattern and the peripheral portion of the first conductive layer is formed.

According to another method of the present invention, the second conductive layer pattern is formed on the insulating layer in a pattern narrower than that of the first conductive layer pattern covered by the insulating layer. Another insulating layer is formed on the second conductive layer pattern. The insulating layers are sequentially patterned to form a via hole exposing the entire top surface of the second conductive layer pattern. The via hole includes an opening that exposes the outer peripheral edge of the second conductive layer. The opening extends downwardly and terminates at a peripheral portion of the first conductive layer pattern. Conductive material is deposited to fill the via hole. Thus, a third conductive layer pattern electrically connecting the top surface of the second conductive layer pattern and the peripheral portion of the first conductive layer is formed.

BRIEF DESCRIPTION OF THE DRAWINGS

These and other objects, features and advantages of the present invention will become more apparent to those skilled in the art by referring to the following detailed description of the preferred embodiments thereof made with reference to the accompanying drawings, of which.

DETAILED DESCRIPTION OF THE PREFERRED EMBODIMENTS

Figure 1:
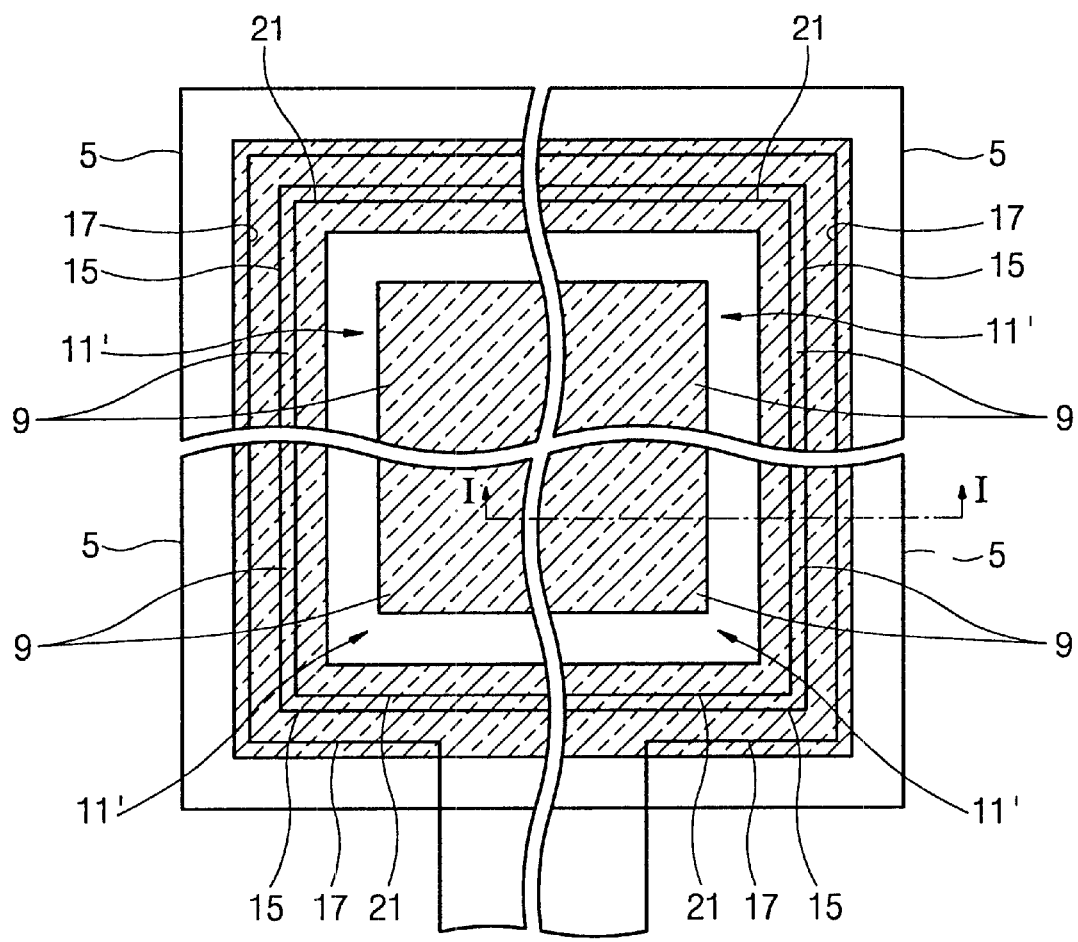
FIG. 1 is a plan view of one embodiment of a bonding pad structure according to the present invention.

The present invention will now be described more fully hereinafter with reference to the accompanying drawings. In the drawings, the thickness of layers and regions are exaggerated for the sake of clarity. It will also be understood that when a layer is referred to as being formed or disposed "over" or "on" another layer or substrate, it can be formed or disposed directly on the other layer or substrate or other layers may be present therebetween. Furthermore, like parts are identified by like reference numbers throughout the drawings.

Figure 2:
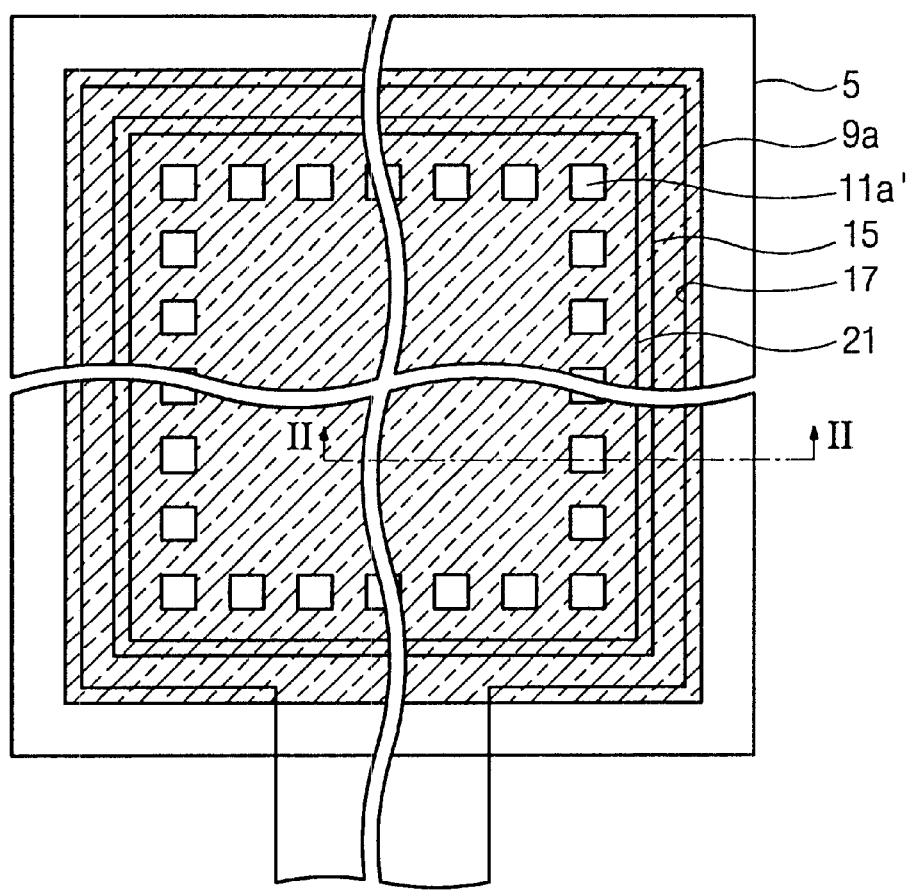
FIG. 2 is a plan view of another embodiment of a bonding pad structure according to the present invention.
Figure 3:
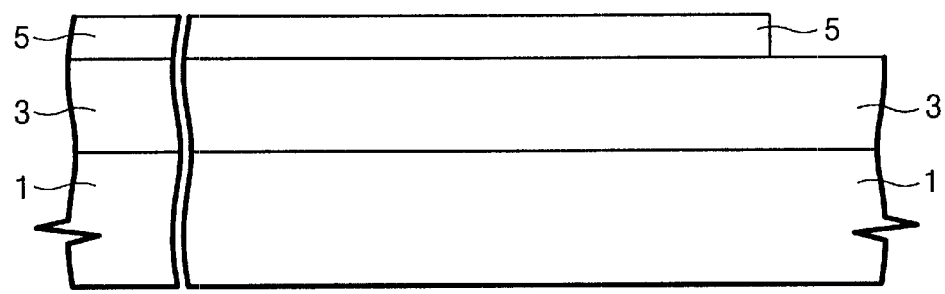
FIGS. 3 to 6 are sectional views taken along the line I—I of FIG. 1 or line II—II of FIG. 2, at selected stages of a method of fabricating the bonding pad structure according to the present invention.

Referring now to FIGS. 1 and 2, a first conductive layer pattern 5 is stacked on a first insulating layer covering an entire surface of a semiconductor substrate. The first conductive layer pattern 5 is formed from a polysilicon pattern or a polycide pattern. A second insulating layer (not shown in these figures) covers the resultant structure. A predetermined portion of the second insulating layer is covered with a second conductive layer pattern 9 or 9a. The second conductive layer pattern 9 or 9a overlies the first conductive layer pattern 5. In the embodiment of FIG. 1, the second conductive layer pattern 9 has an opening 11 therethrough comprising a slit defined at the periphery of the conductive layer pattern 9. In the embodiment of FIG. 2, the second conductive layer pattern 9a has an opening therethrough comprising a plurality of holes 11a' at the periphery thereof. The opening 11' or 11a' exposes a peripheral portion of the first conductive layer pattern 5.

Figure 4:
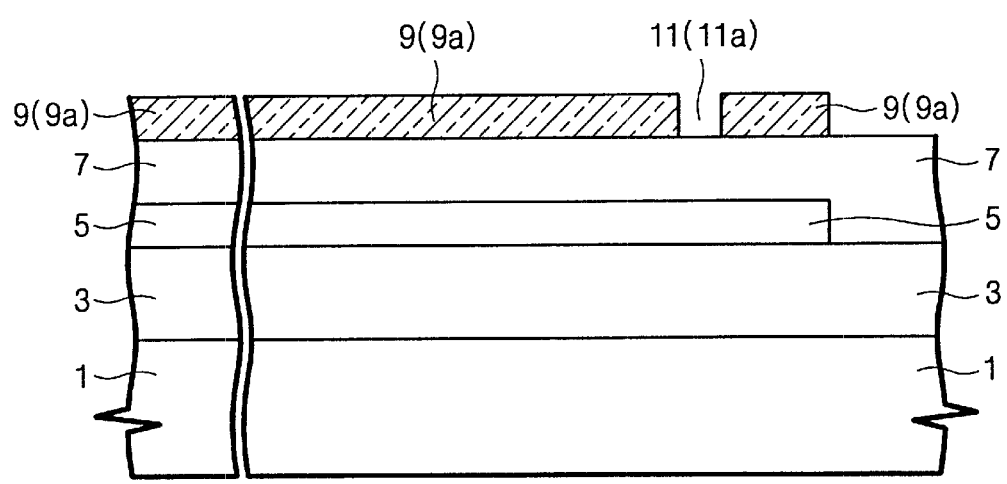

Referring now to FIG. 4, the second insulating layer 7 and the second conductive layer are sequentially formed on the semiconductor substrate 1 over the first conductive layer pattern 5. Before the second conductive layer is formed, the second insulating layer 7 and the first insulating layer 3 may be sequentially patterned to form a metal contact hole (not shown) exposing the semiconductor substrate 1. Here, the second conductive layer corresponds to a first metal layer of a semiconductor device whose fabrication is characterized by a multi-layered metallization technique. As is conventional per se, the first metal layer is an aluminum layer, and can include a barrier metal layer such as a titanium nitride layer. Alternatively, a copper layer may be employed as the first metal layer.

The second conductive layer is then patterned to form a second conductive layer pattern 9 or 9a over the first conductive layer pattern 5. At this time, an opening 11 or 11a is formed adjacent the peripheral edge of the second conductive layer pattern 9 or 9a. Accordingly, the opening 11 or 11a exposes a part of the second insulating layer 7 overlying the periphery of the first conductive layer pattern 5. The opening can consist of a contiguous slit as in the embodiment of FIG. 1 or a plurality of discrete holes as in the embodiment of FIG. 2. Alternatively, the opening 11 can be a plurality of discrete rectangular slits formed at the periphery of the second conductive layer pattern 9.

Figure 5:
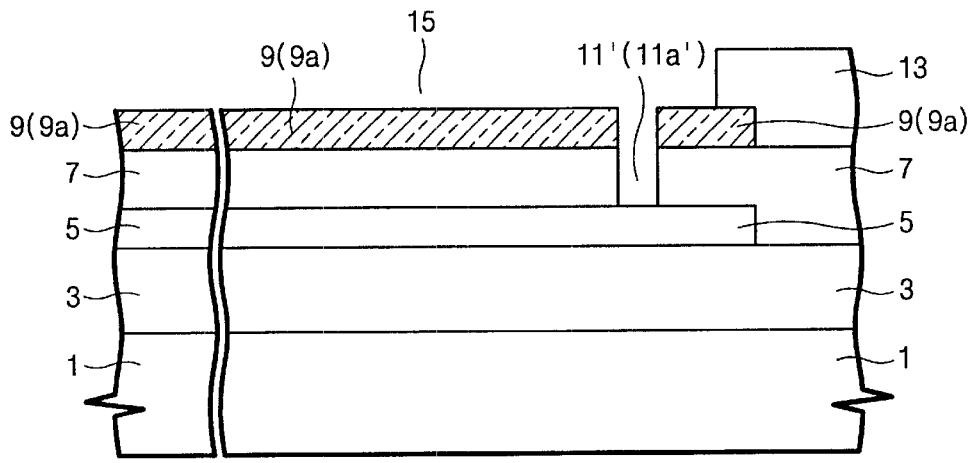

Referring to FIG. 5, the third insulating layer 13, for example, an intermetal dielectric layer, is formed over the entire surface of the structure comprising the second conductive layer pattern 9 or 9a. Subsequently, the third insulating layer 13 and the second insulating layer 7 are sequentially patterned to form a via hole 15. The via hole 15 exposes the entire surface of the second conductive layer pattern 9 or 9a located inwardly of the hole 9 or 9a. At this time, the second insulating layer 7 exposed by the opening 11 or 11a is also etched, whereby the opening 11 or 11a is extended. Accordingly, a peripheral portion of the first conductive layer pattern 5 is exposed by the extended opening 11' or 11a'.

Figure 6:
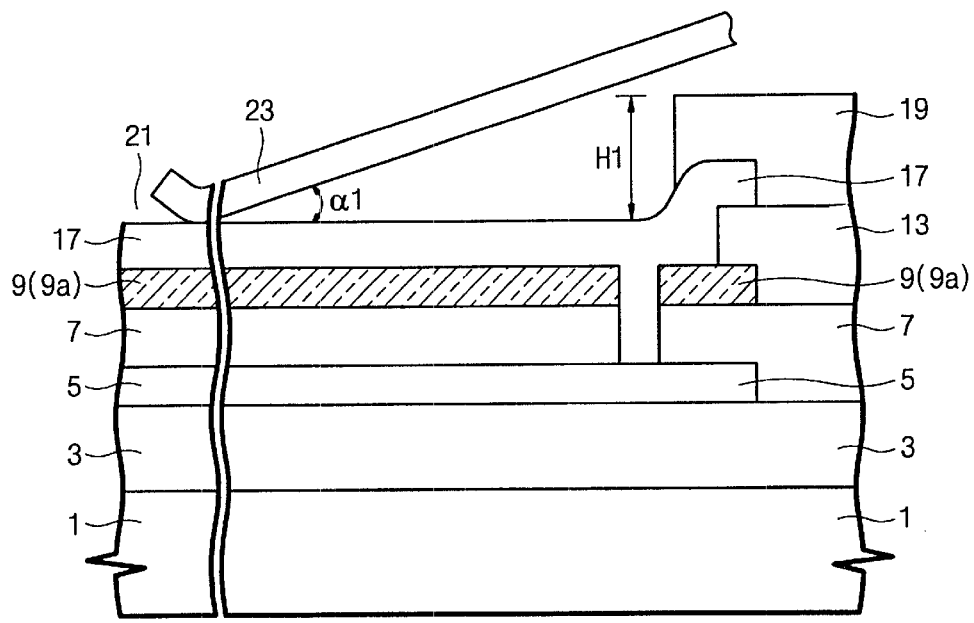

Referring to FIG. 6, the third conductive layer is formed over the entire surface of the resultant structure having the via hole 15. At this time, the opening 11' or 11a' is filled with the third conductive layer. The third conductive layer corresponds to a second metal layer of a semiconductor device whose fabrication is characterised by the use of a multi-layered metallization technique. As is conventional per se, the third metal layer is formed of aluminum and can include a wetting layer such as a titanium layer. The third conductive layer is patterned to form the third conductive layer pattern 17 filling the via hole 15. As a result, the third conductive layer pattern 17 is directly in contact with the second conductive layer pattern 9 or 9a, and is electrically connected to the first conductive layer pattern 5 via the opening 11' or 11a'. In addition, the second insulating layer 7 is interposed between the first conductive layer pattern 5 and the second conductive layer pattern 9 or 9a. As a result, the difference in height between the top surface of the third conductive layer pattern 17, at the center thereof, and the top surface of the third insulating layer 13 is minimal.

Subsequently, a passivation layer 19 is formed in a conventional manner over the entire surface of the resultant structure comprising the third conductive layer pattern 17. The passivation layer 19 serves as a protective layer in the semiconductor device. That is to say, the passivation layer 19 prevents moisture from permeating into the device. Also, the passivation layer 19 prevents a second metal interconnection line (not shown) from being scratched.

The passivation layer 19 is formed of an insulating material that can be formed at a low temperature of 500° C. or less. For example, the passivation layer 19 can be formed by sequentially stacking a plasma oxide layer and plasma nitride layer on the semiconductor substrate. Alternatively, an HDP (high-density plasma) oxide layer having an excellent gap filling characteristic can be used as the passivation layer 19. Also, the passivation layer 19 may comprise an HDP oxide layer interposed between a plasma oxide layer and a plasma nitride layer.

The passivation layer 19 is then patterned to form a pad opening 21 exposing the third conductive layer pattern 17. Accordingly, it is possible to keep to a minimum the difference in height or the so-called "step" (H1) between a top surface of the exposed third conductive layer pattern 17 and a top surface of the passivation layer 19, as shown in FIG. 6. A beam lead 23 is attached to the bonding pad structure by bonding a free end of the lead to the central region of the top surface of the third conductive layer pattern 17.

Note, the smaller the step (H1), the greater the assembly process margin for the beam lead 23 becomes. In particular, the angle (α1) between the beam lead 23 and the third conductive layer pattern 17 can be minimized when a ball gird array technique that is used to connect the beam lead 23 to the center of the third conductive layer pattern 17 is employed. As a result, the alignment margin of the beam lead 23 is increased, thereby providing a reliable thin ball grid array package.

Figure 7:
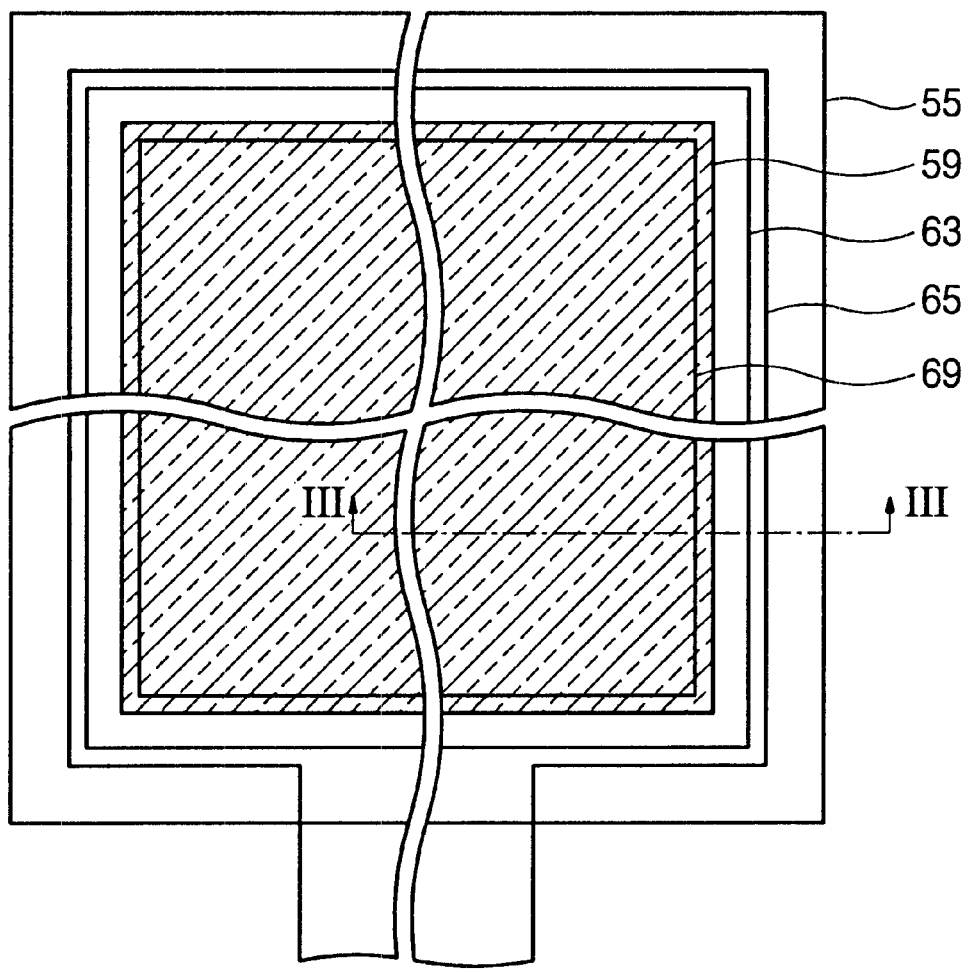
FIG. 7 is a plan view of another embodiment of a bonding pad structure according to the present invention.

FIG. 7 shows another bonding pad structure of the present invention. Referring to FIG. 7, a first conductive layer pattern 55 is stacked on a first insulating layer covering the entire surface of a semiconductor substrate (not shown in the figure). A second insulating layer (also not shown in the figure) covers the resultant structure comprising the first conductive layer pattern 55. A predetermined portion of the second insulating layer is covered with a second conductive layer pattern 59 that overlies the first conductive layer pattern 55. In this embodiment, the second conductive layer pattern 59 is narrower than the first conductive layer pattern 55. Accordingly, the second conductive layer pattern 59 does not lie directly over the peripheral edge portion of the first conductive layer pattern 55. The first conductive layer pattern 55 is formed of the same material as the first conductive layer pattern 5 of the embodiment of FIGS. 1 and 2. Likewise, the second conductive layer pattern 59 is formed of the same material as the second conductive layer pattern 9 or 9a of the embodiment of FIGS. 1 and 2.

The resultant structure having the second conductive layer pattern 59 is covered with a third insulating layer, i.e., an inter-metal dielectric layer. The entire surface of the second conductive layer pattern 59 and a central portion of the first conductive layer pattern 55 are exposed by a via hole 63 penetrating the third insulating layer and the second insulating layer. That is, the via hole 63 is wider than the second conductive layer pattern 59 but narrower than the first conductive layer pattern 55. The via hole 63 is filled with a third conductive layer pattern 65. Accordingly, the third conductive layer pattern 65 is directly in contact with the entire surface of the second conductive layer pattern 59, and is electrically connected to the peripheral edge portion of the first conductive layer pattern 55.

The third conductive layer pattern 65 is made of the same material as the third conductive layer pattern 17 of the embodiment of FIGS. 1 and 2. The entire surface of the semiconductor substrate including the third conductive layer pattern 65 is covered with a passivation layer (not shown). The third conductive layer pattern 65 is exposed by a pad opening 69 formed in a predetermined portion of the passivation layer. The passivation layer is made of the same material as the passivation layer 19 of the embodiment of FIGS. 1 and 2.

FIGS. 8 to 11 are sectional views of the semiconductor substrate, at selected stages of the method of fabricating the bonding pad structure.

Figure 8:
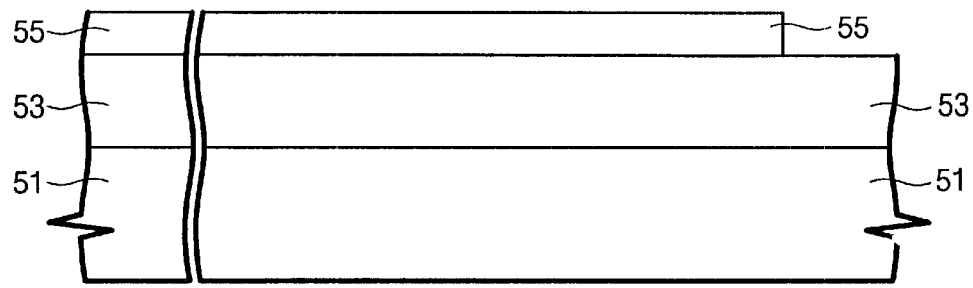
FIGS. 8 to 11 are sectional views taken along line III—III of FIG. 7, at selected stages of a method of fabricating the bonding pad structure according to the present invention.

Referring to FIG. 8, a first insulating layer 53 is formed on a semiconductor substrate 51 such as a silicon wafer. The first conductive layer pattern 55 is formed on a predetermined portion of the first insulating layer 53.

Figure 9:
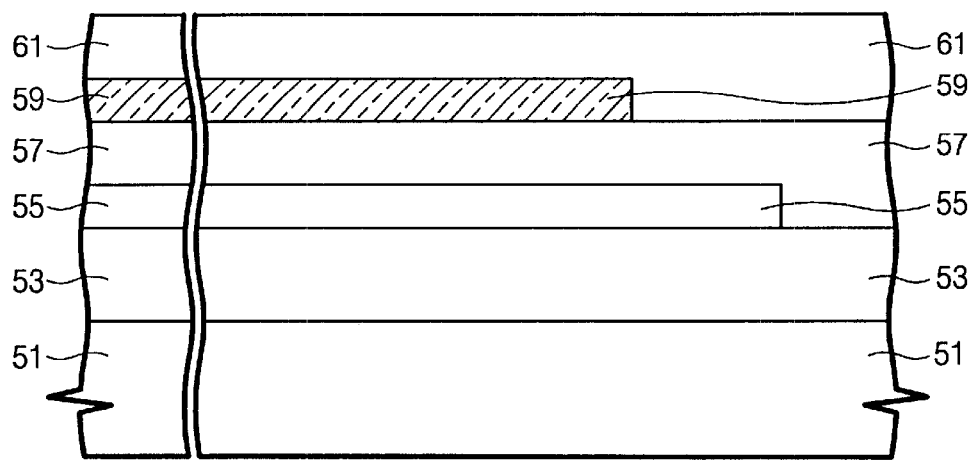

Referring next to FIG. 9, a second insulating layer 57 and a second conductive layer are sequentially formed on the resultant structure comprising the first conductive layer pattern 55. Although not shown in FIG. 9, before the second conductive layer is formed, the second insulating layer 57 and the first insulating layer 53 may be sequentially patterned to form a metal contact hole exposing the semiconductor substrate. The second conductive layer corresponds to a first metal layer of a semiconductor device whose fabrication is characterized by the use of a multi-layered metallization technique. As is conventional per se, the first metal layer is formed of aluminum, and can include a barrier metal layer such as a titanium nitride layer. Alternatively, the first metal layer can be formed of copper.

The second conductive layer is then patterned to form the second conductive layer pattern 59 over the first conductive layer pattern 55. At this time, the second conductive layer pattern 59 is narrower than the first conductive layer pattern 55. Accordingly, as shown in FIG. 9, a peripheral edge portion of the first conductive layer pattern 55 is not covered by the second conductive layer pattern 59. A third insulating layer 61, namely, an inter-metal dielectric layer, is formed over the entire surface of the resultant structure comprising the second conductive layer pattern 59.

Figure 10:
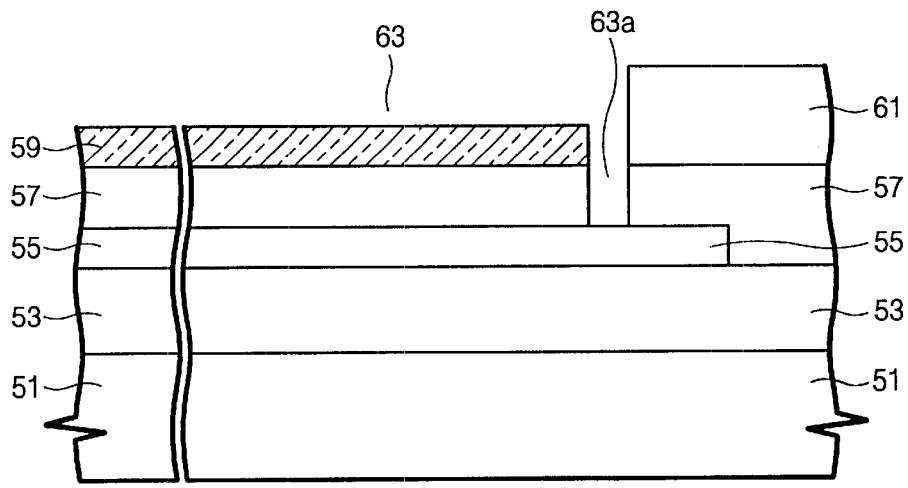

Referring now to FIG. 10, the third insulating layer 61 and the second insulating layer 57 are sequentially patterned to form a via hole 63 exposing the entire surface of the second conductive layer pattern 59. The via hole 63 is wider than the second conductive layer pattern 59 but narrower than the first conductive layer pattern 55. Accordingly, the via hole 63 includes an opening 63a exposing the peripheral edge portion of the first conductive layer pattern 55. In this case, the opening 63a is a slit extending contiguously around the second conductive layer pattern 59.

Figure 11:
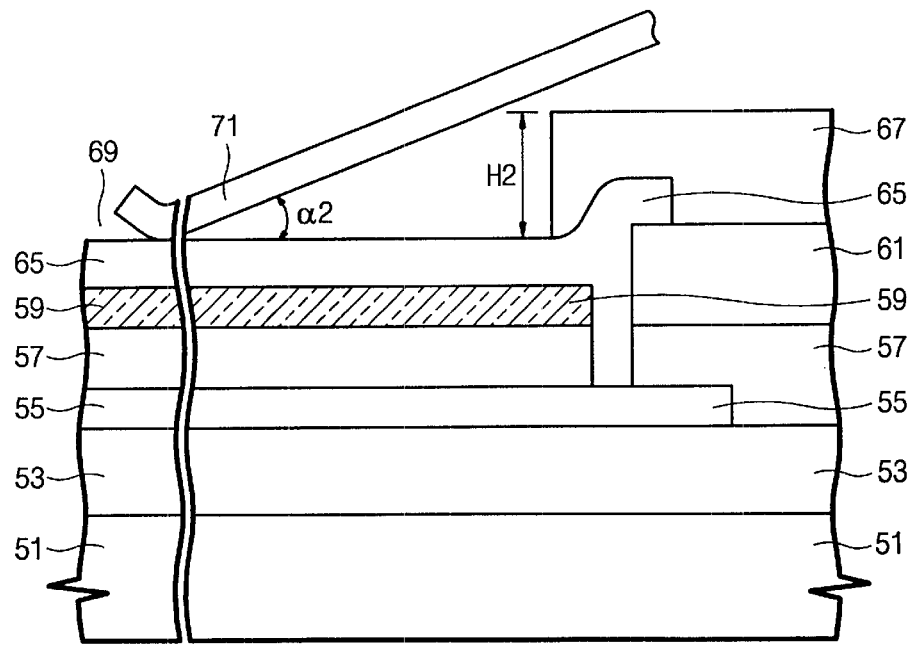

Referring now to FIG. 11, a third conductive layer is formed over the entire surface of the resultant structure having the via hole 63. The opening 63a is thus filled with conductive material. The third conductive layer is then patterned to form a third conductive layer pattern 65 filling the via hole 63. As a result, the third conductive layer pattern 65 is directly in contact with the top surface of the second conductive layer pattern 59, and is electrically connected to the peripheral edge portion of the first conductive layer pattern 55 through the opening 63a.

Subsequently, the passivation layer 67 is formed over the entire surface of the resultant structure comprising the third conductive layer pattern 65. The passivation layer 67 is then patterned to form a pad opening 69 exposing the third conductive layer pattern 65. Accordingly, the step (H2) between the top surface of the exposed third conductive layer pattern 65 and the top surface of the passivation layer 67 can be minimized as in the embodiment shown in FIGS. 3 to 6. The free end of a beam lead 71 is bonded to the central region of the top surface of the third conductive layer pattern 65.

Again, the smaller the step (H2), the smaller the angle (α2) becomes between the beam lead 71 and the third conductive layer pattern 65 when the thin ball gird array (BGA) package technique is employed as the above-mentioned bonding process. As a result, the alignment margin of the beam lead 71 is relatively high, thereby providing a reliable thin BGA.

As described above, the present invention increases the margin of the assembly process, e.g., the BGA package technique. Thus, it is possible to realize a reliable thin BGA package. In addition, the third conductive layer pattern is directly in contact with the top surface of the second conductive layer pattern, and an insulator is interposed between the second and first conductive layer patterns. Accordingly, when a gold wire or beam lead is bonded to the third conductive layer pattern, the stress applied to the third conductive layer pattern is minimized.

Although the present invention has been described with respect to the preferred embodiments thereof, various changes thereto and modifications thereof will be apparent to those of ordinary skill in the art. Such changes and modifications are seen to be within the true spirit and scope of the present invention, as defined by the appended claims.

What is claimed is:

1. Structure of a semiconductor device for electrically connecting the semiconductor device to external electronics, said structure comprising:

a first insulating layer disposed on a semiconductor substrate;

a first conductive layer pattern covering only a portion of the first insulating layer;

a second insulating layer covering the first conductive layer pattern and the first insulating layer;

a second conductive layer pattern disposed on only a portion of the second insulating layer, the second conductive layer pattern lying directly over the first conductive layer pattern;

said second insulating layer and said second conductive layer pattern constituting a layered structure having an opening defined adjacent the peripheral edge of the second conductive layer pattern, the opening exposing a peripheral edge portion of the first conductive layer pattern;

a third insulating layer disposed on the second insulating layer, the third insulating layer having a via hole extending therethrough from the top surface thereof opposite the second insulating layer and exposing both the second conductive layer pattern and said opening; and a third conductive layer pattern filling the via hole, the third conductive layer pattern being directly in contact with the entire top surface of the second conductive layer pattern, and being electrically connected to the first conductive layer pattern via said opening.

2. The semiconductor device structure according to claim 1, wherein the first conductive layer pattern is a polysilicon pattern.

3. The semiconductor device structure according to claim 1, wherein the second conductive layer pattern is a metal pattern, and the first metal pattern located above the semiconductor substrate.

4. The semiconductor device structure according to claim 1, wherein said opening extends through a peripheral edge portion of the second conductive layer pattern.

5. The semiconductor device structure according to claim 4, wherein said opening is a contiguous slit extending alongside the entire peripheral edge of the second conductive layer pattern.

6. The semiconductor device structure according to claim 4, wherein said opening comprises a plurality of discrete holes extending through said peripheral edge portion as spaced radially inwardly from the peripheral edge of the second conductive layer pattern and as spaced from one another in a direction corresponding to said peripheral edge.

7. The semiconductor device structure according to claim 1, wherein said opening is located radially outwardly of the peripheral edge of said second conductive layer pattern and comprises a slit exposing and extending alongside the peripheral edge of the second conductive layer pattern.

8. The semiconductor device structure according to claim 1, wherein the third conductive layer pattern is a metal pattern, and the second metal pattern located above the semiconductor substrate.

9. The semiconductor device structure according to claim 1, and further comprising a passivation layer disposed on the third conductive layer pattern, the passivation layer having a pad opening exposing the third conductive layer pattern.

10. The semiconductor device structure according to claim 1, wherein a top surface of the third conductive layer pattern is left exposed by the third insulating layer, and further comprising an electrical lead having a free end bonded to a central portion of the top surface of said third conductive layer pattern.

11. A bonding pad structure of a semiconductor device for electrically connecting the semiconductor device to external electronics, said bonding pad structure comprising:

a first insulating layer disposed on a semiconductor substrate;

a first conductive layer pattern covering only a portion of the first insulating layer;

a second insulating layer covering the first conductive layer pattern and the first insulating layer;

a second conductive layer pattern disposed on only a portion of the second insulating layer, the second conductive layer pattern lying directly over the first conductive layer pattern;

said second insulating layer and said second conductive layer pattern constituting a layered structure having an opening defined adjacent the peripheral edge of the second conductive layer pattern, the opening exposing a peripheral edge portion of the first conductive layer pattern;

a third insulating layer disposed on the second insulating layer, the third insulating layer having a via hole extending therethrough from the top surface thereof opposite the second insulating layer and exposing both the second conductive layer pattern and said opening; and a third conductive layer pattern filling the via hole, the third conductive layer pattern being directly in contact with the entire top surface of the second conductive layer pattern, and being electrically connected to the first conductive layer pattern via said opening.

* * * * *